(12) United States Patent
Schwartz et al.

(10) Patent No.: US 9,498,858 B2
(45) Date of Patent: Nov. 22, 2016

(54) SYSTEM AND METHOD FOR DISSIPATING THERMAL ENERGY

(71) Applicant: SEAKR Engineering, Inc., Centennial, CO (US)

(72) Inventors: Tim Schwartz, Thornton, CO (US); Steve Torline, Aurora, CO (US)

(73) Assignee: SEAKR ENGINEERING, INC., Centennial, CO (US)

( * ) Notice: Subject to any disclaimer, the term of this patent is extended or adjusted under 35 U.S.C. 154(b) by 306 days.

(21) Appl. No.: 14/455,668

(22) Filed: Aug. 8, 2014

(65) Prior Publication Data

US 2016/0044821 A1    Feb. 11, 2016

(51) Int. Cl.
| | |
|---|---|
| F24H 3/00 | (2006.01) |
| B23P 15/26 | (2006.01) |
| H05K 7/14 | (2006.01) |
| H05K 7/20 | (2006.01) |

(52) U.S. Cl.
CPC ............ B23P 15/26 (2013.01); H05K 7/1434 (2013.01); H05K 7/20336 (2013.01); H05K 7/20418 (2013.01)

(58) Field of Classification Search
CPC . B23P 15/26; H05K 7/1434; H05K 7/20336; H05K 7/20418; Y02B 30/00; Y02B 80/00; F28F 1/00; F28F 3/12; F28F 3/14; F28F 9/013; F28F 9/0246; F28D 9/0081
USPC ............ 165/47, 48.1, 53, 56, 177, 178, 168, 165/170, 171
See application file for complete search history.

(56) References Cited

U.S. PATENT DOCUMENTS

| | | | | |
|---|---|---|---|---|
| 1,771,268 A | * | 7/1930 | Musgrave | F24D 3/14 123/169 V |
| 2,000,539 A | * | 5/1935 | Beach | F24D 3/14 165/169 |
| 2,506,596 A | * | 5/1950 | Howard | H01J 7/24 165/181 |
| 3,049,341 A | * | 8/1962 | Kemp | F24D 3/16 165/136 |
| 3,796,254 A | * | 3/1974 | Stooksberry | F28F 13/00 165/185 |
| 4,316,434 A | | 2/1982 | Bailey | |
| 4,646,814 A | * | 3/1987 | Fennesz | F24D 3/142 165/56 |
| 4,819,011 A | * | 4/1989 | Yokota | B41J 2/325 165/104.11 |
| 5,076,351 A | | 12/1991 | Munekawa et al. | |
| 5,156,208 A | * | 10/1992 | Masuki | F28D 1/0226 165/104.21 |
| 5,255,520 A | | 10/1993 | O'Geary et al. | |
| 5,332,030 A | | 7/1994 | Spencer et al. | |
| 5,735,489 A | * | 4/1998 | Drolen | B64G 1/50 244/171.8 |
| 5,764,483 A | | 6/1998 | Ohashi et al. | |
| 6,069,793 A | | 5/2000 | Maruyama et al. | |

(Continued)

FOREIGN PATENT DOCUMENTS

| | | |
|---|---|---|
| CN | 102012183 A | 4/2011 |
| WO | 2012059565 A2 | 5/2012 |

*Primary Examiner* — Justin Jonaitis
(74) *Attorney, Agent, or Firm* — Perkins Coie LLP

(57) ABSTRACT

A system for dissipating thermal energy from an enclosure includes a gusset having a base engagement face and an enclosure engagement face that may be removably coupled with the enclosure. In some embodiments, a heat pipe extends along a gusset frame between portions of the base engagement face and the enclosure engagement face. The heat pipe is angularly shaped in various embodiments and is thermally coupled with the base engagement face and the enclosure engagement face. In some embodiments, the heat pipe is coupled within a heat pipe channel that extends along a length of the gusset.

20 Claims, 8 Drawing Sheets

(56) References Cited

U.S. PATENT DOCUMENTS

| | | |
|---|---|---|
| 6,215,657 B1 | 4/2001 | Bhatia |
| 6,397,935 B1 | 6/2002 | Yamamoto et al. |
| 6,418,017 B1 | 7/2002 | Keshner et al. |
| 6,776,220 B1 | 8/2004 | Low et al. |
| 6,795,310 B2 | 9/2004 | Ghosh et al. |
| 6,994,152 B2 | 2/2006 | Rosenfeld et al. |
| 7,028,760 B2 | 4/2006 | Minnerly et al. |
| 7,032,653 B1 | 4/2006 | Chang |
| 7,857,037 B2 * | 12/2010 | Parish .............. F28D 15/0233 165/104.21 |
| 8,050,028 B2 | 11/2011 | Merz et al. |
| 8,418,478 B2 | 4/2013 | Parish, IV et al. |
| 2008/0289801 A1 | 11/2008 | Batty et al. |
| 2010/0175855 A1 | 7/2010 | Chen |
| 2011/0103011 A1 | 5/2011 | Zadesky et al. |
| 2013/0120937 A1 | 5/2013 | Liao et al. |
| 2013/0199770 A1 | 8/2013 | Cherian et al. |

* cited by examiner

SYSTEM AND METHOD FOR DISSIPATING THERMAL ENERGY

BACKGROUND

Computer assemblies and other electronics are frequently housed within electronics enclosures for a wide array of applications in different environments. The computer assemblies and electronics generate heat within the electronics enclosures. The more power that is dissipated by the electronics, the higher the temperature within the electronics enclosure rises. As temperatures increase, risk of overheating and damage to the computer assemblies and electronics also increases.

Some electronics enclosures are coupled within systems that operate in harsh environments. For example, satellites and other orbiting craft typically include electronics enclosures. Oftentimes, as a satellite orbits the Earth, one side is typically exposed to the direct radiation of the sun while the opposite side is exposed to the deep cold of space. This causes severe discrepancies in the temperature within the satellite and the electronics enclosure, which can reduce the reliability and accuracy of the satellite's electronics. Cooling systems associated with such systems are designed to manage the high heat fluctuations with and without the influence of gravity. This task is complicated by the unique environment of space, which can present: widely varying external conditions, such as eclipses; micro-g environment; heat removal from the spacecraft by thermal radiation; limited available electrical power; and long operational lifetimes, with little to no possibility of maintenance.

Electronics enclosures are often constructed as conduction cooled electronics assemblies to manage the heat produced by the electronics within the electronics enclosures. A basic conduction cooled electronics assembly design rejects heat through its base. Some designs embed heat pipes into the enclosure walls. The heat pipes provide a means of directing the heat from the electronics to the base of the enclosure with a lower temperature rise than would be possible with the enclosure alone. However, such electronics enclosures require a custom design for each such electronics enclosure, including complex heat pipe bends and expensive tooling. Accordingly, extensive design time and costs become prohibitive to using custom electronics enclosures. For assemblies where weight is less of a concern, the electronics enclosure can be constructed using thicker enclosure pieces, which increase the conduction capacity, thereby reducing the temperature of the electronics. However, weight is usually a premium concern, regardless of where the system employing the electronics enclosure operates.

Electronics enclosures that are coupled within satellites and other orbiting craft are launched into orbit by various launch vehicles. The launch of such vehicles is a violent, vibrating, and shaking event. The vibrations and movement of the vehicle are easily translated to its payload and the sensitive systems therein. Accordingly, electronics enclosures require structural support to reduce the likelihood of damage to the enclosure and its contents. Such structural supports are commonly provided in the form of custom enclosure designs with integrated structural supports. Such custom designs, however, add extensive design time and costs to any project. Depending on the project, these custom enclosure designs can become prohibitive.

Accordingly, the prior art has, heretofore, failed to provide a relatively low cost, light weight, electronics enclosure that can be implemented for a wide array of different uses with a minimum of custom design requirements.

SUMMARY

This Summary is provided to introduce a selection of concepts in a simplified form that are further described below in the Detailed Description. This Summary, and the foregoing Background, is not intended to identify key aspects or essential aspects of the claimed subject matter. Moreover, this Summary is not intended for use as an aid in determining the scope of the claimed subject matter.

Provided herein is a structural support that assists in transferring heat away from a heat source, such as electronics within an electronics enclosure. In various embodiments, the structural support is a gusset having a base engagement face and an enclosure engagement face. A gusset frame extends between the base engagement face and the enclosure engagement face. In some embodiments, an elongated heat pipe is disposed within the gusset frame and is thermally coupled with the base engagement face and the enclosure engagement face.

In some embodiments, a heat pipe channel extends along portions of the enclosure engagement face and the gusset frame. The elongated heat pipe is disposed within the heat pipe channel, along the gusset frame, penetrating a substantial length of the enclosure engagement face. In particular embodiments, an engagement surface of the heat pipe is positioned to be co-planar with the enclosure engagement face and a second end portion of the heat pipe is disposed within a plane in which the base engagement face resides.

In various embodiments, the enclosure engagement face cantilevers outwardly from opposite sides of the gusset frame to define enclosure mounting flanges. Similarly, the base engagement face may be provided to cantilever outwardly from opposite sides of the gusset frame to define base mounting flanges. The enclosure mounting flanges and base mounting flanges are each penetrated by a plurality of fastener apertures that, in some embodiments, are sized to receive mechanical fasteners.

In a method of use, a base engagement face of a heat pipe gusset is secured to the base plate of an enclosure so that a heat pipe within the gusset is thermally coupled with the base plate. An enclosure engagement face of the heat pipe gusset is secured with the enclosure, adjacent the heat generating source, so that a length of the heat pipe is thermally coupled with the enclosure to assist in transferring thermal energy from the interior of the enclosure to the base plate. The heat pipe gusset is positioned with respect to an enclosure sidewall and the enclosure base plate such that the heat pipe provides structural support between the base plate and the enclosure sidewall.

These and other aspects of the technology will be apparent after consideration of the Detailed Description and Figures herein.

DRAWINGS

Non-limiting and non-exhaustive embodiments of the present technology, including the preferred embodiment, are described with reference to the following figures, wherein like reference numerals refer to like parts throughout the various views unless otherwise specified.

DETAILED DESCRIPTION

Figure 1:
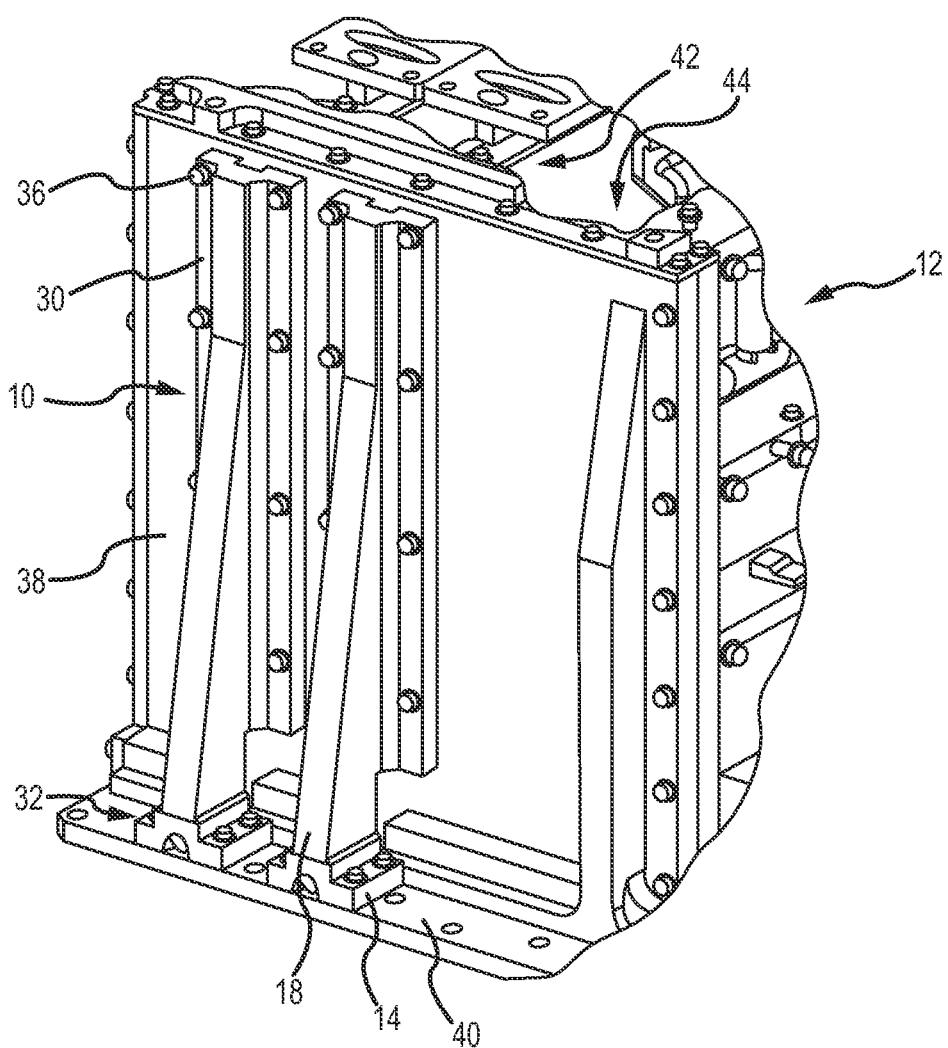
FIG. 1 is a partial isometric view of one embodiment of a plurality of heat pipe gussets of the present technology and depicting one manner in which they may be removably coupled with an electronics enclosure.
Figure 2:
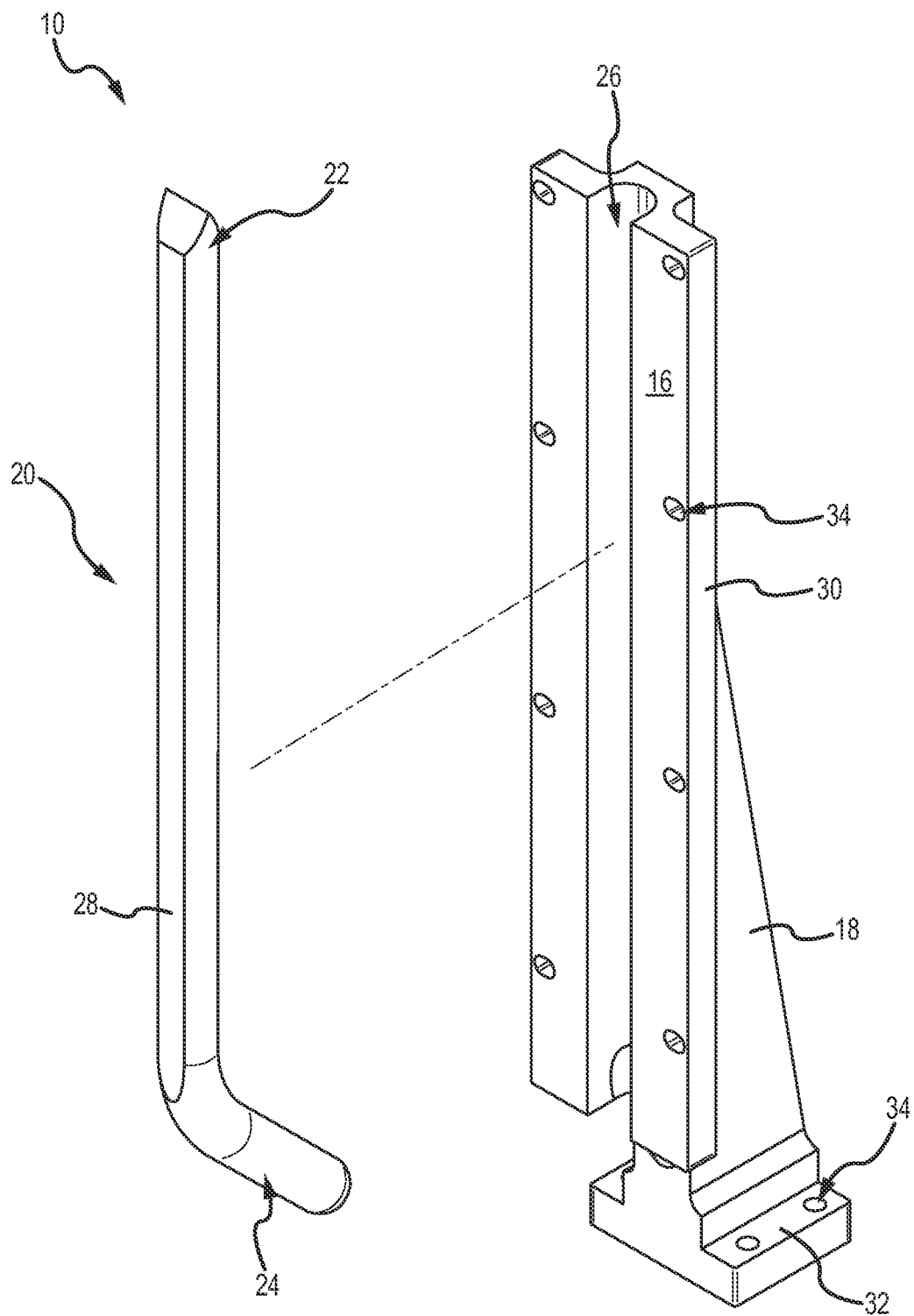
FIG. 2 is a perspective, exploded view of one embodiment of a heat pipe gusset and heat pipe of the present technology.
Figure 3:
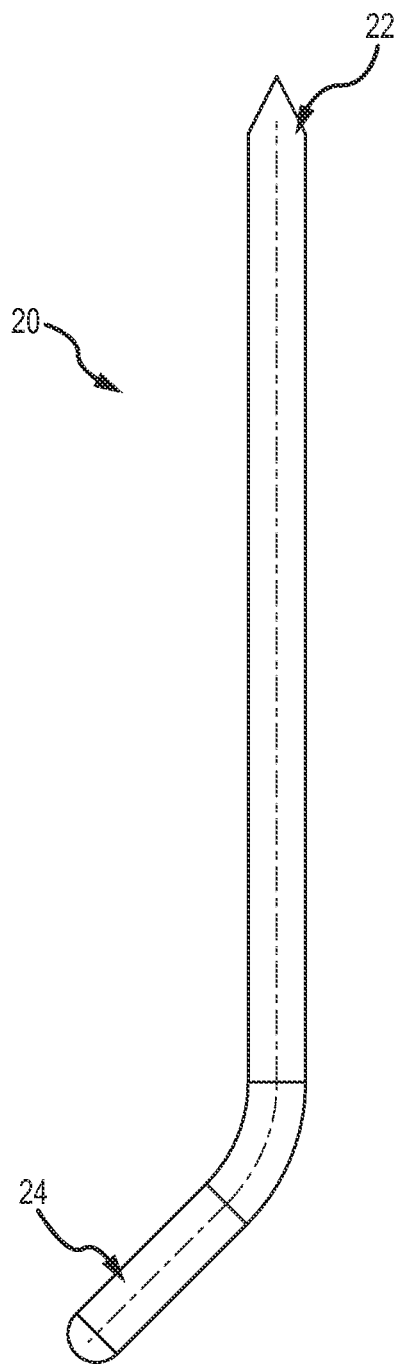
FIG. 3 is a side elevation view of the heat pipe depicted in FIG. 2.
Figure 4:
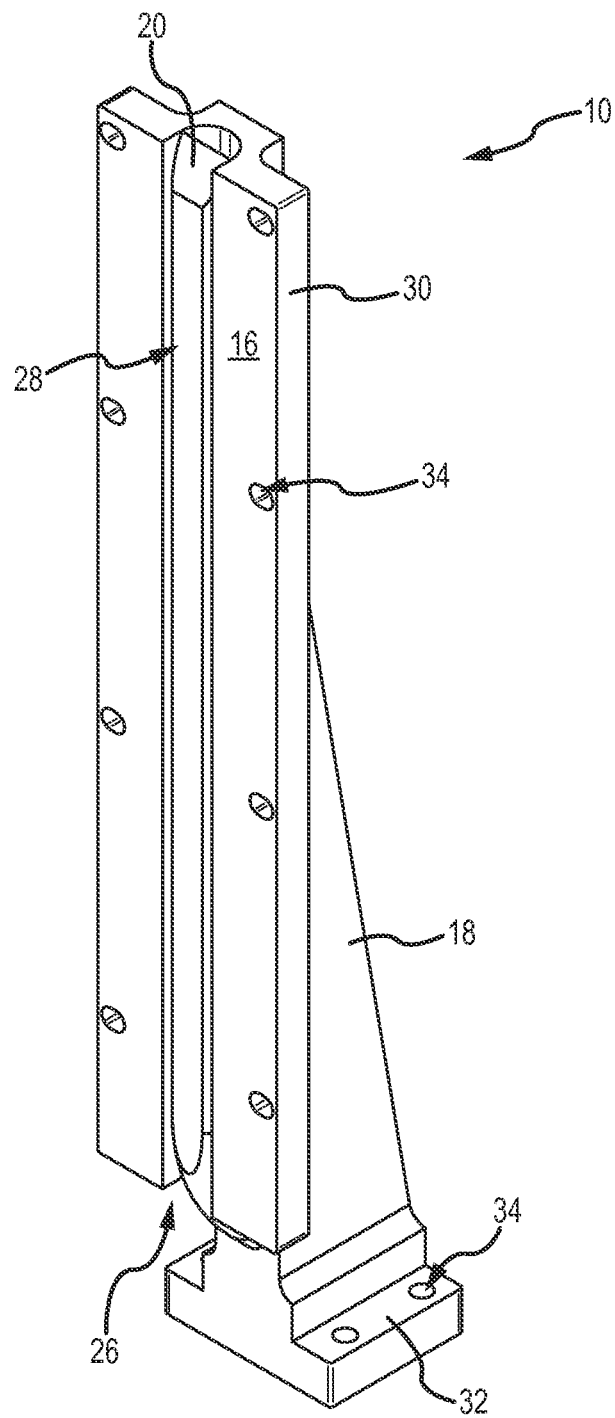
FIG. 4 is an assembled, rear perspective view of the heat pipe gusset depicted in FIG. 2.

Embodiments are described more fully below with reference to the accompanying figures, which form a part hereof and show, by way of illustration, specific exemplary embodiments. These embodiments are disclosed in sufficient detail to enable those skilled in the art to practice the invention. However, embodiments may be implemented in many different forms and should not be construed as being limited to the embodiments set forth herein. The following detailed description is, therefore, not to be taken in a limiting sense.

With reference to FIGS. 1-10, embodiments of a structural support, such as the removable heat pipe gusset 10, are depicted that dissipate thermal energy from a conduction cooled structure and, in particular embodiments, an electronics enclosure 12. Embodiments of the heat pipe gusset 10 combine a structural gusset support and a two-phase heat transfer device. Some embodiments of the technology mechanically couple the gusset and the two-phase heat transfer device to one another. In other embodiments, structural aspects of the gusset and the two-phase heat transfer device may be shared or combined with one another, such that aspects of the gusset and two-phase heat transfer device are be formed in uniform construction with one another.

Various embodiments, the heat pipe gusset 10 includes a base engagement face 14 and an enclosure engagement face 16. In the depicted embodiments, the base engagement face 14 and enclosure engagement face 16 reside within different planes. In some embodiments, base engagement face 14 and enclosure engagement face 16 are perpendicular with one another. It is contemplated, however, that the orientation of the base engagement face 14 and the enclosure engagement face 16 will depend on the configuration of the electronics enclosure 12. A gusset frame 18 extends from the base engagement face 14 and the enclosure engagement face 16 in a manner that secures the base engagement face 14 and enclosure engagement face 16 with one another. It is contemplated that the gusset 10 will be formed from a conductive material. In many applications, the conductive material may be selected from materials having desirable weight to strength ratios. For example, in particular embodiments, the gusset is machined from 6061-T6 aluminum. While it is contemplated that the heat pipe gusset 10 could be formed from a modular construction, such as a separate base engagement face 14, enclosure engagement face 16, and/or gusset frame 18, embodiments such as those depicted in at least FIGS. 1-14, are made from uniform construction.

An elongated heat pipe 20, having a first end portion 22 and a second end portion 24 is disposed within the gusset frame 18. In this position, the heat pipe 20 is thermally coupled with the base engagement face 14 and the enclosure engagement face 16. In various embodiments, the elongated heat pipe 20 may be of a standard heat pipe design, having a casing formed from a thermally conductive material, such as copper. The heat pipe interior includes a wick (not depicted) such as sintered metal powder, such as sintered copper, one of a variety of screens, or grooved wicks. A working fluid (also not depicted) such as water, is disposed within the heat pipe interior. In other embodiments, the working fluid could be provided from other known substances, based on the temperatures at which the heat pipe gusset 10 must operate. For example liquid helium may be selected for extremely low temperature applications (2-4 K) to mercury (523-923 K), sodium (873-1473 K) and even indium (2000-3000 K) for extremely high temperatures. Other working fluids, for more moderate temperature applications, may be ammonia (213-373 K), alcohol (methanol (283-403 K) or ethanol (273-403 K)) or water (298-573 K) as the working fluid.

In some embodiments, the heat pipe 20 is disposed within a heat pipe channel 26 that extends along portions of the enclosure engagement face 16 and the gusset frame 18. In particular embodiments, such as those depicted in FIGS. 2, 4, 6, and 7, the heat pipe channel 26 extends along and penetrates a substantial length of the enclosure engagement face 16, such that the heat pipe channel 26 is open along its length. It is contemplated that the heat pipe 20 may be provided in a wide variety of different cross-sectional shapes. Accordingly, while the heat pipe 20 is depicted as having a generally round cross-section, it is contemplated that the cross-section could be oval, curvilinear, polygonal, or other cross-sectional shape that best suits the intended use of the heat pipe gusset 10 and heat pipe 20. It is contemplated that a cross-sectional shape of the heat pipe channel 26 will, in many embodiments, be complimentary to the cross-sectional shape of the heat pipe 20, such that the heat pipe 20 nests within the heat pipe channel 26. It is contemplated that the heat pipe 20 could be loosely disposed within the heat pipe channel 26 or press/friction-fit therein. However, in particular embodiments, the heat pipe 20 is soldered within the heat pipe channel 26. In such embodiments, where a casing of the heat pipe 20 is formed from copper and the gusset is made from either aluminum or copper, the gusset 10, or at least the heat pipe channel 26, may be nickel plated to facilitate soldering the heat pipe 20 within the heat pipe channel 26.

In some embodiments, an engagement surface 28 of the heat pipe 20 is positioned to be co-planar with the enclosure engagement face 16. The engagement surface 28 of the heat pipe 20 may be substantially planar, in such embodiments, in order to increase the available surface area of the engagement face 28. In this manner, the engagement surface 28 may nearly, or completely, span the opening of the heat pipe channel 26 that extends through the enclosure engagement face 16. Where the elongated heat pipe 20 has a round cross-sectional shape, the engagement surface 28 may be formed by pressing flat the portion of the elongated heat pipe 20 that protrudes beyond the enclosure engagement face 16.

Figure 5:
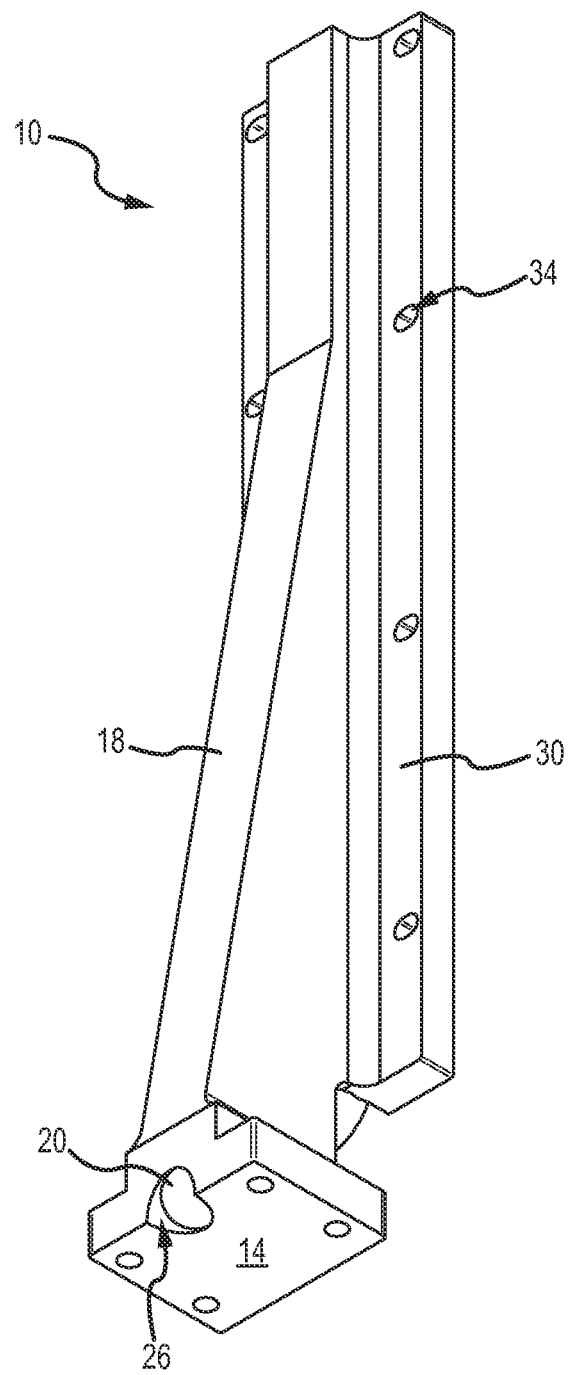
FIG. 5 is a front perspective view of the heat pipe gusset depicted in FIG. 2.
Figure 6:
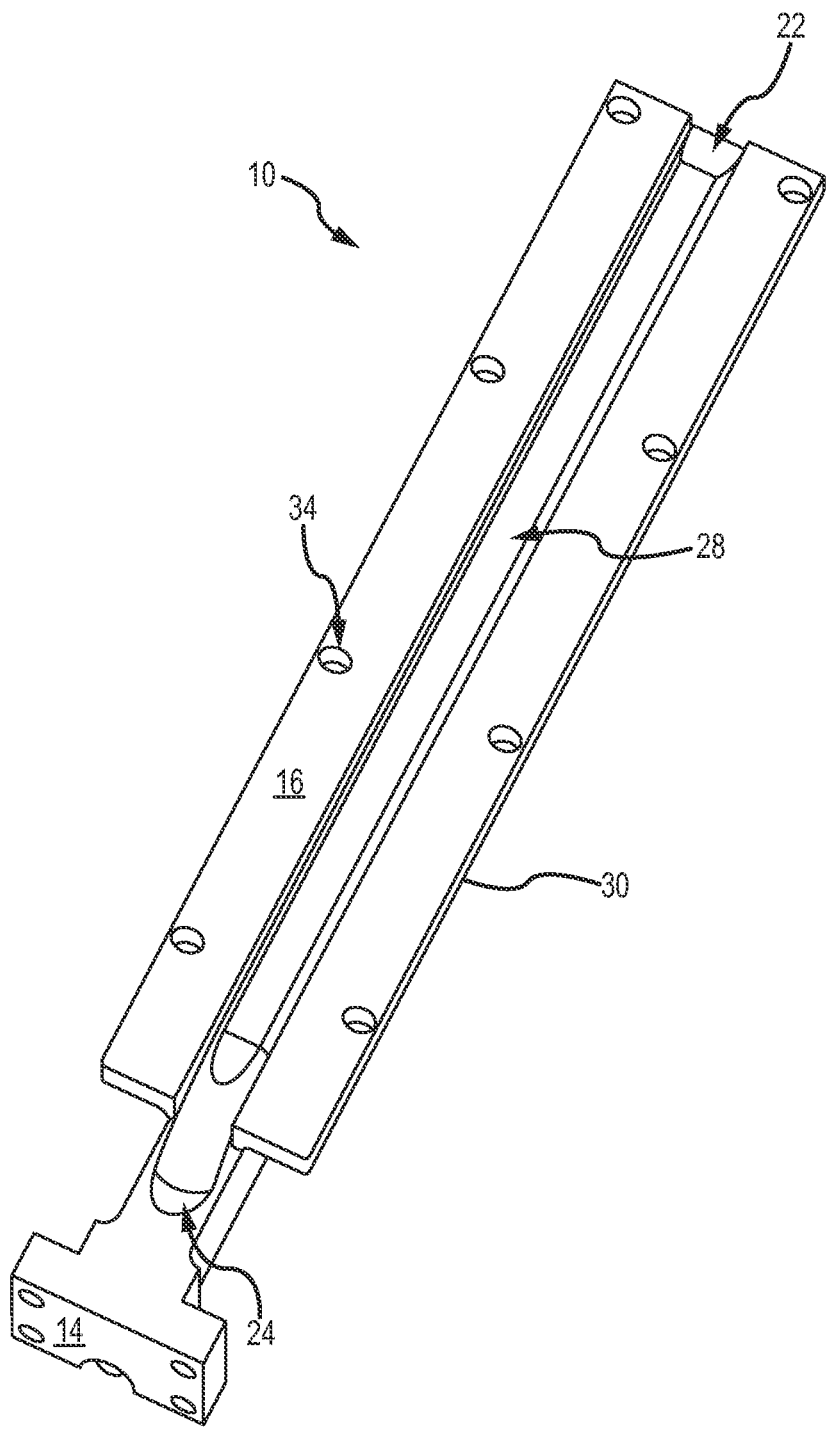
FIG. 6 is a lower rearward perspective view of the heat pipe gusset depicted in FIG. 2.
Figure 7:
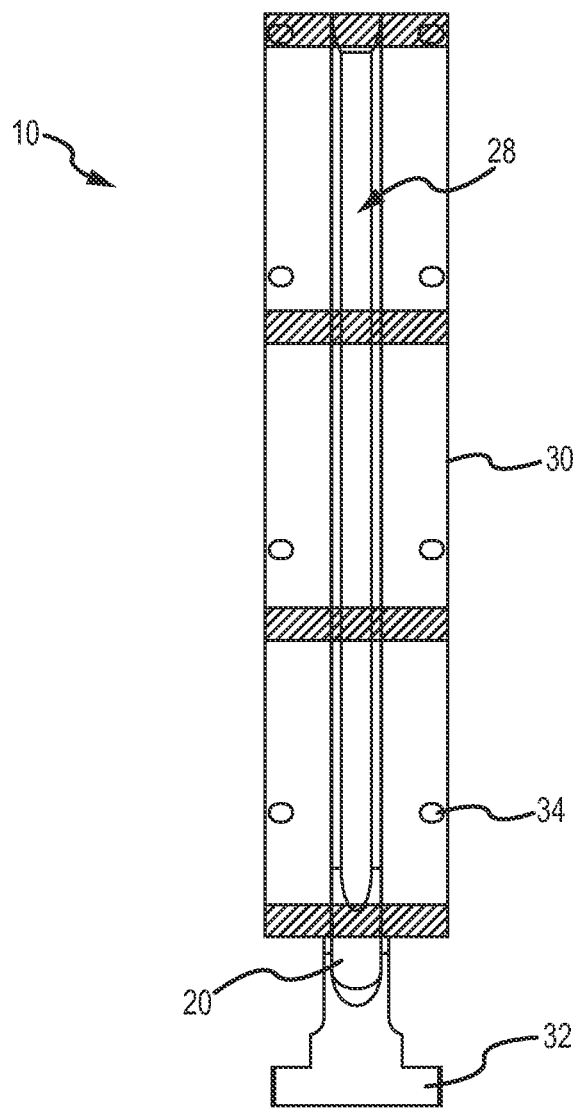
FIG. 7 is a rear elevation view of heat pipe gusset depicted in FIG. 2.
Figure 8:
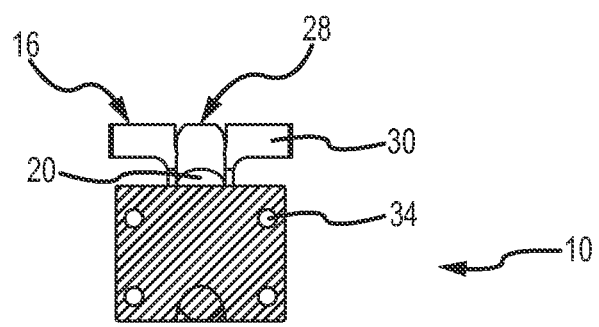
FIG. 8 is a bottom plan view of the heat pipe gusset depicted in FIG. 2.
Figure 9:
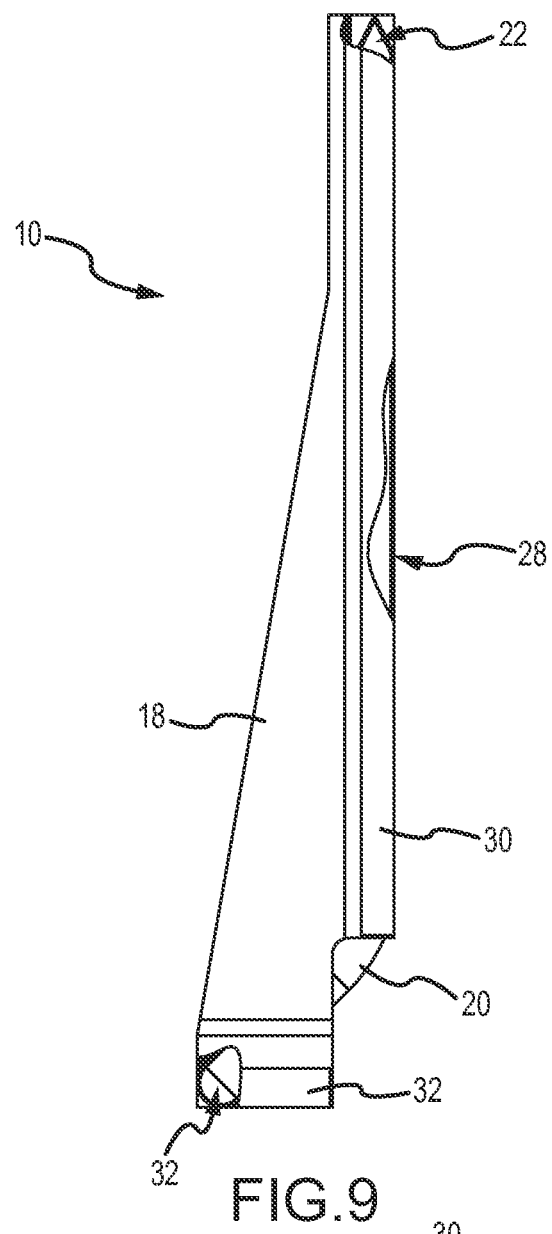
FIG. 9 is a partial cut-away, side elevation view of the heat pipe gusset depicted in FIG. 2.
Figure 10:
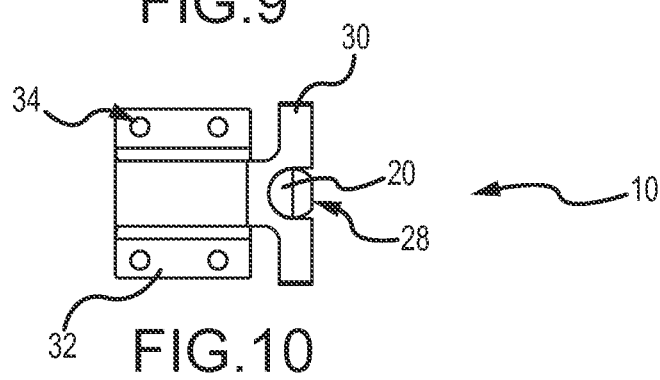
FIG. 10 is a top plan view of the heat pipe gusset depicted in FIG. 2.

With reference to FIGS. 2-4, 6, and 9, the elongated heat pipe 20 is depicted as having an angular shape. In the depicted embodiment, the second end portion 24 is disposed at a forty-five degree angle with respect to the first end portion 22. In other embodiments, the second end portion 24 is disposed at a ninety degree angle with respect to the first end portion 22. In still other embodiments, the second end portion 24 is disposed at an angle between forty-five degrees and ninety degrees with respect to the first end portion 22. These configurations allow for a substantial portion of the elongated heat pipe 20 to extend from its first end portion 22 in a manner that is co-planar with the enclosure engagement face 16 of the heat pipe gusset 10. In the depicted embodiments, the enclosure engagement face 16 and the base engagement face 14 are positioned to be spaced apart from one another, both along a long axis that extends through the enclosure engagement face 16 and a long axis that extends through the base engagement face 14. In this manner, from one perspective, the base engagement face 14 is positioned below and forward from the enclosure engagement face 16. Accordingly, the elongated heat pipe 20 extends to a lower end portion of the enclosure engagement face 16 and bends forwardly toward the base engagement face 14. In at least some embodiments, such as depicted within FIGS. 5 and 9, the second end portion 24 of the elongated heat pipe 20 is positioned within the plane in which the base engagement portion 14 resides. The heat pipe channel 26 is formed within the heat pipe gusset 10 wherever the elongated heat pipe 20 is to be disposed. Accordingly, in some embodiments, the heat pipe channel may penetrate a forward end portion and lower end portion of the base engagement face, such as depicted in FIGS. 5 and 9. This encourages thermal coupling between the elongated heat pipe 20 and each of the primary structures of the heat pipe gusset 10. In this position, the first end portion 22 of the heat pipe 20 serves as the evaporator that receives a substantial portion of the thermal energy from the electronics enclosure 12 and transfers the thermal energy toward the second end portion 24 of the heat pipe 20, which serves as the condenser.

In various embodiments, the heat pipe gusset 10 is made for modular, removable construction with structures, such as the electronics enclosure 12. Accordingly, in some embodiments, such as those depicted in FIGS. 1 and 5, the enclosure engagement face 16 cantilevers outwardly from opposite sides of the gusset frame 18 to define enclosure mounting flanges 30. Similarly, the base engagement face 16 cantilevers outwardly from opposite sides of the gusset frame 18 to define base mounting flanges 32. The enclosure mounting flanges 30 and base mounting flanges 32 are, in various embodiments, each penetrated by a plurality of fastener apertures 34. The fastener apertures 34 are sized to receive mechanical fasteners, such as bolts 36. In this manner, the heat pipe gusset 10 may be removably secured to nearly any structure.

In some methods of use, one or more heat pipe gussets 10 may be secured with a structure, such as the electronics enclosure 12. In such embodiments, the electronics enclosure will typically have a plurality of sidewalls 38 and a base plate 40, which are formed from thermally conductive materials. A peripheral edge portion of the base plate 40 will, in some embodiments, extend outwardly from a peripheral edge defined by the plurality of sidewalls 38. This provides a mounting flange that receives the base engagement face 14 of the heat pipe gusset 10. The heat pipe gussets 10 will be shaped so that, as the base engagement face 14 is positioned against the base plate 40, the enclosure engagement face 16 is positioned against a sidewall 30. Where mechanical fasteners, such as bolts 36, are used, a pattern of fastener apertures, match the pattern formed within the heat pipe gusset 10 may be formed within the sidewall 38 and base plate 40. This permits removable engagement between the heat pipe gussets 10 and the electronics enclosure 12. It is contemplated, however, that the heat pipe gussets 10 may be permanently secured with an electronics enclosure 12 through welding or other known methods. In view of the fact that one or more heat pipe gussets 10 are added after initial construction of the electronics enclosure 12, the heat pipe gussets 10 may be added to existing electronics enclosure designs or be incorporated in new designs. This greatly reduces time and expenditure on custom designs for electronics enclosures.

With reference to FIG. 1, it is contemplated that the heat pipe gussets 10 may be put at end or side portions of the electronics enclosure 12. One heat pipe gusset 10, or a plurality thereof, may be provided at each end or side as deemed appropriate for the intended use of the electronics enclosure 12. The design of the heat pipe gussets 10 provide lateral rigidity between the sidewall 38 and base plate 40 to which they are coupled. Within the electronics enclosure 12, various electronics or other heat generating structures 42 may be secured within an interior 44 of the enclosure. In various embodiments, the heat generating structures are thermally coupled with the sidewalls 38 to which heat pipe gussets 10 are coupled. In this manner, the transfer of thermal energy may occur from the heat generating structures 42, to the sidewall 38, to the heat pipe gusset 10 and elongated heat pipe 20, and the base plate 40. In at least some embodiments, the base plate 40 is coupled to a heat sink.

Accordingly, aspects of the present technology effectively dissipate thermal energy from the electronics enclosure 12 while retaining or increasing the structural integrity of the electronics enclosure 12. The removable nature of the heat pipe gusset 10 provide a significant reduction in design time and cost, limiting the need for custom enclosure designs.

Although the technology and methods of using and/or applying the same have been described in language that is specific to certain structures, materials, and methodological steps, it is to be understood that the invention defined in the appended claims is not necessarily limited to the specific structures, materials, and/or steps described. Rather, the specific aspects and steps are described as forms of implementing the claimed invention. Since many embodiments of the invention can be practiced without departing from the spirit and scope of the invention, the invention resides in the claims hereinafter appended. Unless otherwise indicated, all numbers or expressions, such as those expressing dimensions, physical characteristics, etc. used in the specification (other than the claims) are understood as modified in all instances by the term "approximately." At the very least, and not as an attempt to limit the application of the doctrine of equivalents to the claims, each numerical parameter recited in the specification or claims which is modified by the term "approximately" should at least be construed in light of the number of recited significant digits and by applying ordinary rounding techniques. Moreover, all ranges disclosed herein are to be understood to encompass and provide support for claims that recite any and all subranges or any and all individual values subsumed therein. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

What is claimed is:

1. A structural support that assists in transferring heat away from a heat source, the structural support comprising:
   a heat pipe gusset having a base engagement face and an enclosure engagement face; the base engagement face and enclosure engagement face residing within different planes; a gusset frame extending from the base engagement face and the enclosure engagement face in a manner that secures the base engagement face and enclosure engagement face with one another; and an elongated heat pipe having first and second end portions disposed within the gusset frame and thermally coupled with the base engagement face and the enclosure engagement face.

2. The structural support of claim 1 further comprising:
a heat pipe channel extending along portions of the enclosure engagement face and the gusset frame; the elongated heat pipe being disposed within the heat pipe channel, along the gusset frame, wherein the heat pipe channel extends along and penetrates a substantial length of the enclosure engagement face.

3. The structural support of claim 2 wherein an engagement surface of the heat pipe is positioned to be co-planar with the enclosure engagement face.

4. The structural support of claim 3 wherein the heat pipe has a curvilinear cross-sectional shape and the engagement surface of the heat pipe is substantially planar.

5. The structural support of claim 2 wherein the heat pipe channel penetrates the base engagement face.

6. The structural support of claim 5 wherein the heat pipe channel extends rearwardly from the base engagement face at an angle toward the enclosure engagement face.

7. The structural support of claim 6 wherein the heat pipe is positioned so that a second end portion of the heat pipe is disposed within the plane in which the base engagement face resides.

8. The structural support of claim 1 wherein the enclosure engagement face cantilevers outwardly from opposite sides of the gusset frame to define enclosure mounting flanges.

9. The structural support of claim 8 wherein the base engagement face cantilevers outwardly from opposite sides of the gusset frame to define base mounting flanges.

10. The structural support of claim 9 wherein the enclosure mounting flanges and base mounting flanges are each penetrated by a plurality of fastener apertures.

11. A method of transferring heat away from a heat generating source disposed within an enclosure having enclosure sidewalls and a base plate, the method comprising:
securing a base engagement face of a heat pipe gusset with the base so that a heat pipe within the gusset is thermally coupled with the base plate; and
securing an enclosure engagement face of the heat pipe gusset with an enclosure sidewall, adjacent the heat generating source, so that a length of the heat pipe is thermally coupled with the enclosure sidewall; the base engagement face and enclosure engagement face residing within different planes;
the gusset being positioned with respect to the enclosure sidewall and the base plate such that a gusset frame of the heat pipe gusset extends between the base plate and the enclosure sidewall and provides structural support between the base plate and the enclosure sidewall.

12. The method of claim 11 wherein the base engagement face is removably secured to the base plate with a plurality of mechanical fasteners that at least partially penetrate the base engagement face and the base plate.

13. The method of claim 11 wherein the enclosure engagement face is removably secured to the enclosure sidewall with a plurality of mechanical fasteners that at least partially penetrate the enclosure engagement face and the enclosure sidewall.

14. In combination:
an enclosure having an interior portion defined, at least partially, by enclosure sidewalls and a base plate; the enclosure sidewalls and base being at least partially formed from a heat conductive material;
at least one heat generating electrical device disposed within the interior portion of the enclosure and thermally coupled with at least one of the enclosure sidewalls and the base plate;
a structural support including:
a heat pipe gusset having a base engagement face and an enclosure engagement face; the base engagement face and enclosure engagement face residing within different planes; a gusset frame extending from the base engagement face and an enclosure engagement face in a manner that secures the base engagement face and enclosure engagement face with one another; and
an elongated heat pipe having first and second end portions disposed within the gusset frame; the heat pipe being thermally coupled with the base engagement face and the enclosure engagement face;
the base engagement face of the gusset being secured with the base plate so that a portion of the heat pipe is thermally coupled with the base plate; and
the enclosure engagement face of the gusset being secured with an enclosure sidewall, adjacent the heat generating electrical device, so that a length of the heat pipe is thermally coupled with at least one enclosure sidewall.

15. The combination of claim 14 further comprising:
a heat pipe channel extending along portions of the base engagement face, enclosure engagement face, and the gusset frame; the elongated heat pipe being disposed within the heat pipe channel, along the gusset frame, wherein the heat pipe channel extends along and penetrates a substantial length of the enclosure engagement face.

16. The combination of claim 14 wherein the base engagement face is removably secured to the base plate with a plurality of mechanical fasteners that at least partially penetrate the base engagement face and the base plate.

17. The combination of claim 14 wherein the enclosure engagement face is removably secured to the enclosure sidewall with a plurality of mechanical fasteners that at least partially penetrate the enclosure engagement face and the enclosure sidewall.

18. The combination of claim 14 wherein the heat pipe has a curvilinear cross-sectional shape but for a generally planar engagement surface; the engagement surface of the heat pipe positioned co-planar with the enclosure engagement face.

19. The combination of claim 14 wherein the heat pipe channel penetrates the base engagement face and is positioned so that an end portion of the heat pipe is disposed within the plane in which the base engagement face resides.

20. The combination of claim 14 wherein:
the enclosure engagement face cantilevers outwardly from opposite sides of the gusset frame and heat pipe channel to define enclosure mounting flanges; and
the base engagement face cantilevers outwardly from opposite sides of the gusset frame and heat pipe channel to define base mounting flanges;
the enclosure mounting flanges and base mounting flanges are each penetrated by a plurality of fastener apertures.

* * * * *